(12) United States Patent
Plukphongrat et al.

(10) Patent No.: US 6,414,600 B1
(45) Date of Patent: Jul. 2, 2002

(54) GROUND CHECK SYSTEM FOR DELTA-FLEX TEST HANDLER

(75) Inventors: Lunchakorn Plukphongrat; Athipat Ratanavarinchai, both of Bangkok; Keerati Sugasi, Pakkret, all of (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/706,563

(22) Filed: Nov. 6, 2000

(51) Int. Cl.[7] .............................................. G08B 13/08
(52) U.S. Cl. ....................... 340/649; 340/652; 340/660; 340/661; 361/212; 361/324; 361/509; 361/510
(58) Field of Search ................................ 340/649, 652, 340/660, 661; 361/212; 324/509, 510

(56) References Cited

U.S. PATENT DOCUMENTS

| | | | | | |
|---|---|---|---|---|---|
| 4,228,475 A | * | 10/1980 | Sherwood | ..................... | 361/47 |
| 4,967,158 A | * | 10/1990 | Gonzalez | ..................... | 324/536 |
| 5,422,630 A | * | 6/1995 | Quinn et al. | ................. | 340/661 |
| 5,969,626 A | * | 10/1999 | Maciel | ........................ | 340/649 |
| 6,140,929 A | * | 10/2000 | Gannon | ....................... | 340/649 |

* cited by examiner

*Primary Examiner*—Julie Lieu
(74) *Attorney, Agent, or Firm*—Davis Chin

(57) ABSTRACT

There is provided a ground check system used with an input module and/or sort module of a test handler for checking automatically grounding wires associated with moving parts thereof. The ground check system includes a sensing circuit which is responsive to ESD voltages associated with the grounding wires and to a reference voltage for generating an output voltage. A visual indicator device is mounted on the input module and/or sort module of the test handler and is responsive to the output voltage for alerting an operator of a malfunction in the grounding wires. An output buffer section is also responsive to the output voltage for shutting down the input module and/or sort module when there is a malfunction in the grounding wires.

7 Claims, 3 Drawing Sheets

GROUND CHECK SYSTEM FOR DELTA-FLEX TEST HANDLER

BACKGROUND OF THE INVENTION

This invention relates generally to test handler systems for semiconductor integrated circuit (IC) devices. More particularly, it relates to a ground check system used with a test handler for checking automatically the grounding of the equipment and for shutting down the same if a grounding malfunction exists.

As is generally well-known, there has been a trend in recent years of manufacturing semiconductor integrated circuit devices with smaller and smaller physical size dimensions. In fact, the semiconductor integrated circuit devices have become so miniaturized so as to contain hundreds or thousands of circuit elements formed on a single semiconductor substrate. Along with these technical advances made in the manufacturing process, there have also been developed test equipment so as to test the semiconductor integrated circuit devices accurately, reliably and at a high rate in order to determine the quality of the devices being manufactured prior to shipment to a customer.

Therefore, various types of automatic testing and handling equipment have been developed to handle the semiconductor integrated circuit devices during the testing process. For example, there are known in the art of automatic, high volume handling systems which include an input module for loading the semiconductor integrated circuit devices and for moving them into contact with a testing device and a sort module for sorting the tested devices based upon the test results. Such prior art test handler systems are manufactured and sold by Delta-Design, Inc. of San Diego, Calif., under their Model Nos. 1210, 1220, and 1240.

It is also known that during the assembly of the semiconductor I.C. devices they are very susceptible to electrostatic discharge (ESD) which may cause damage to the devices and/or even destroy them completely. Thus, it is very important to be able to strictly control the ESD voltage in the manufacturing process. Further, in the test handler system used for testing of the devices there are various moving parts such as the input heads of a "pick and place" mechanism and the input quad arm in the input module which are potential sources of electrostatic discharge. In addition, the output heads, the sleeve pusher, and the output retriever board of the sort module of the test handler system may also cause problems due to the ESD voltage. Consequently, all of these moving parts are required to be grounded so as to eliminate the ESD voltage that is created during their operation.

However, in view of the fact that these various parts are moving, their grounding wires are very susceptible to becoming loose or damaged. At present, there does not exist a satisfactory indication means in the prior art test handler systems for informing an operator whether the grounding wires are actually positioned in their proper position and are functioning under normal conditions. Therefore, it would be desirable to provide a ground check system for use with a test handler that would alert an operator when the ESD voltage has not been properly neutralized through the grounding wires of the equipment parts. Further, it would be expedient that the ground check system be capable of immediately terminating the devices from being loaded into the equipment.

SUMMARY OF THE INVENTION

Accordingly, it is a general object of the present invention to provide a ground check system used with a test handler for checking automatically the grounding of the equipment which has traditionally been unavailable heretofore.

It is an object of the present invention to provide a ground check system used with a test handler for checking automatically the grounding of the equipment and for shutting down the same if a grounding malfunction exists.

It is another object of the present invention to provide a ground check system for use with a test handler that would alert an operator when the ESD voltage has not been properly neutralized through the grounding wires of the equipment.

It is still another object of the present invention to provide a ground check system which includes means for terminating the devices from being loaded into the equipment if a grounding malfunction exists.

It is yet still another object of the present invention to provide a ground check system which includes visual indicator means for alerting an operator that a grounding wire is not functioning properly.

In a preferred embodiment of the present invention, there is provided a ground check system used with an input module and/or sort module of a test handler for checking automatically grounding wires associated with moving parts thereof. The ground check system includes a sensing circuit which is responsive to an ESD voltage associated with the grounding wires and to a fixed reference voltage for generating an output voltage. A visual indicator device is mounted on the input and/or sort module of the test handler and is responsive to the output voltage for alerting an operator of a malfunction in the grounding wires. An output buffer section is also responsive to the output voltage and is used to shut down the input and/or sort module when there is a malfunction in the grounding wires.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
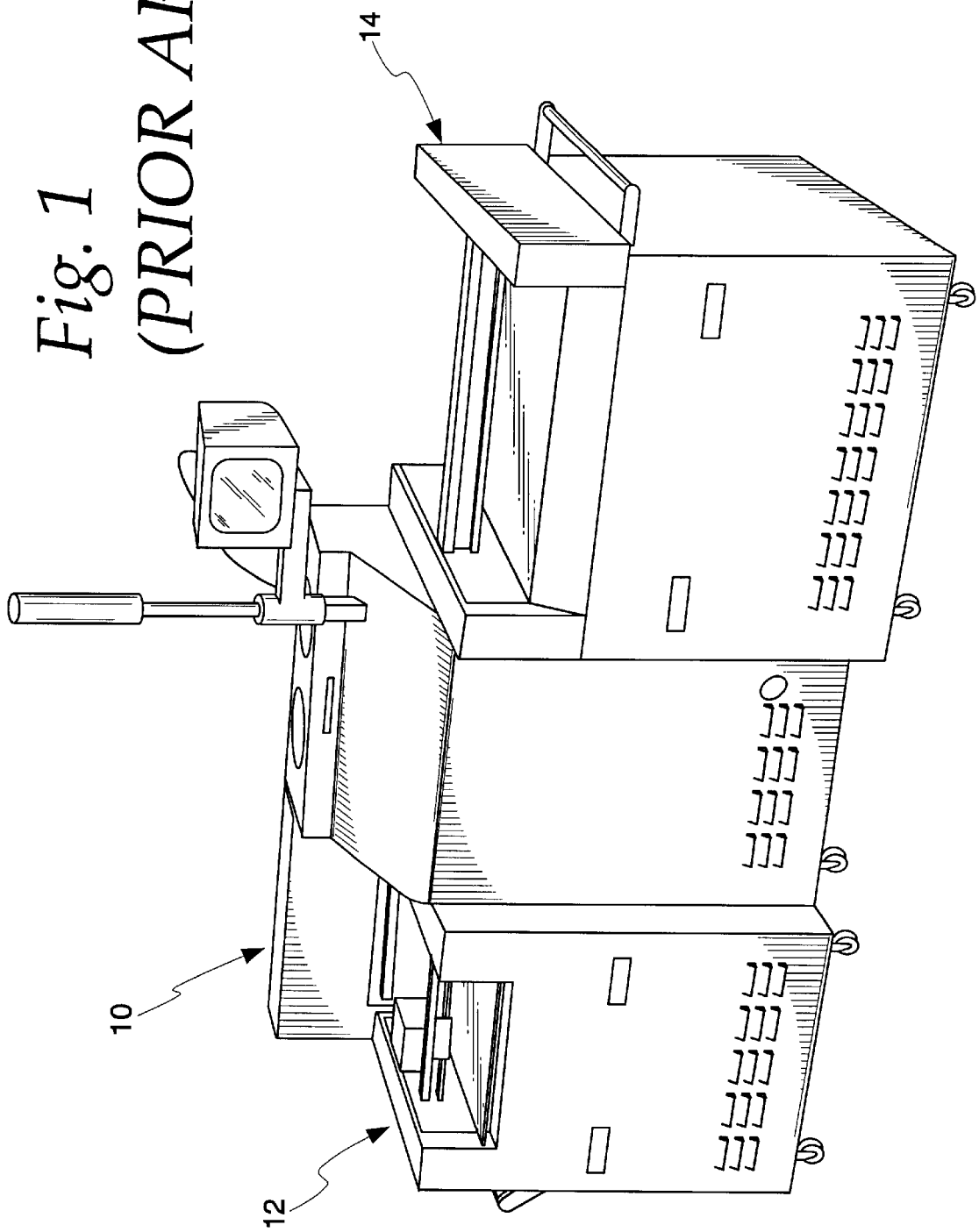
FIG. 1 illustrates a prior art test handler system for testing semiconductor I.C. devices.

As was previously pointed out, test handler systems have been designed heretofore for subjecting packaged semiconductor I.C. devices and similar electrical/electronic components to various electrical and environmental tests so as to ensure certain characteristics before they are shipped to a customer. Typically, these prior art test handler systems include a loader section for loading semiconductor I.C.

devices to be tested and for moving them to a testing section for testing and an unloading section for sorting the tested devices in accordance with the test results. Such a prior test handler system 10 for testing semiconductor I.C. devices is illustrated in FIG. 1 which includes a loading section 12 and an unloader section 14. The test handler system 10 is similar to the ones commercially available from Delta Design, Inc., such as Model Nos. 1210, 1220 or 1240.

Unfortunately, the prior art test handler system 10 does not provide a way of informing the operator or user whether the grounding wires of the equipment in the loading or unloading sections are functioning properly in the presence of an ESD voltage. Thus, the purpose of the present invention is to provide a visual indicator means which can be installed on the input and/or sort modules of the traditional test handler system in order to notify the operator of malfunctioning grounding wires in the equipment. Although fault protection devices against overvoltage conditions caused by ESD are known in the art, none of these previously developed protection devices has been designed to function with the input and/or sort module of a traditional test handler system.

Figure 2:
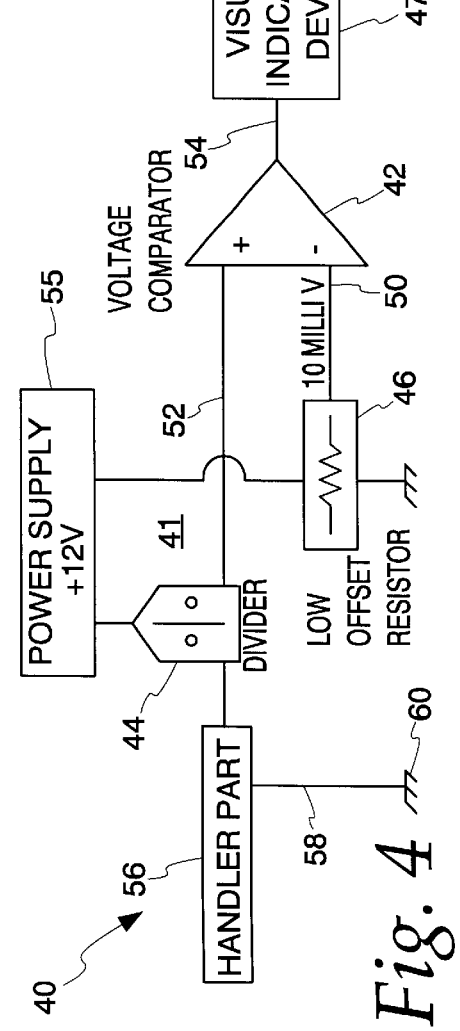
FIG. 2 is a graphical representation of an input module of the present invention for use in the test handler system of FIG. 1.

Referring now to FIG. 2 of the drawings, there is shown a graphical representation of an input module 20 of the present invention which is particularly adapted for use in the loading section 12 of the traditional test handler system 10 in FIG. 1. The input module 20 functions to load the semiconductor I.C. devices and to move them to a tester for testing, and to transfer them to the unloading section after the test has been completed. The input module 20 includes a first input head 22, a second input head 24, and an input quad arm 26, each of which corresponds to a moving part and an associated grounding wire. Each of the grounding wires are physically coupled to an earth ground so as to eliminate the electrostatic voltage created during their operation. The associated grounding wires have a high degree of becoming loosened or damaged due to their very nature of being connected to the moving parts. Further, the input module includes a ground check system 40 for automatically checking the grounding of the equipment and for shutting down the same if one of the grounding wires become loosened so that an ESD voltage appears. The ground check system 40 will be explained more fully hereinafter.

Figure 3:
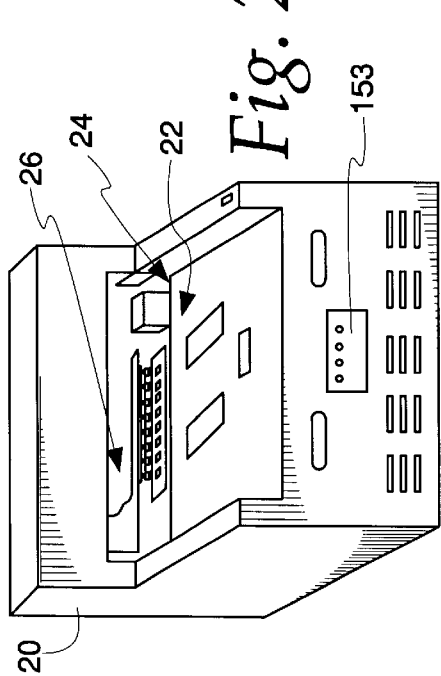
FIG. 3 is a graphical representation of a sort module of the present invention for use in the test handler system of FIG. 1.

Similarly, in FIG. 3 of the drawings, there is shown a graphical representation of a sort module 30 of the present invention which is particularly adapted for use in the unloading section 14 of the traditional test handler system 10 in FIG. 1. The sort module 30 serves to sort or separate the tested semiconductor I.C. devices in response to the test results. The sort module 30 includes a first output head 32, a second output head 34, a sleeve pusher 36, and an output retriever board 38, each of which corresponds to a moving part and an associated grounding wire. Again, each of the grounding wires are physically coupled to an earth ground so as to eliminate the electrostatic voltage created during their operation. The associated grounding wires are susceptible to become loosened or disconnected due to their connection to the moving parts. In addition, the sort module 30 also includes the ground check system 40 for automatically checking the grounding of the equipment and for shutting down the same if one of the grounding wires become loose so that an ESD voltage appears.

Figure 4:
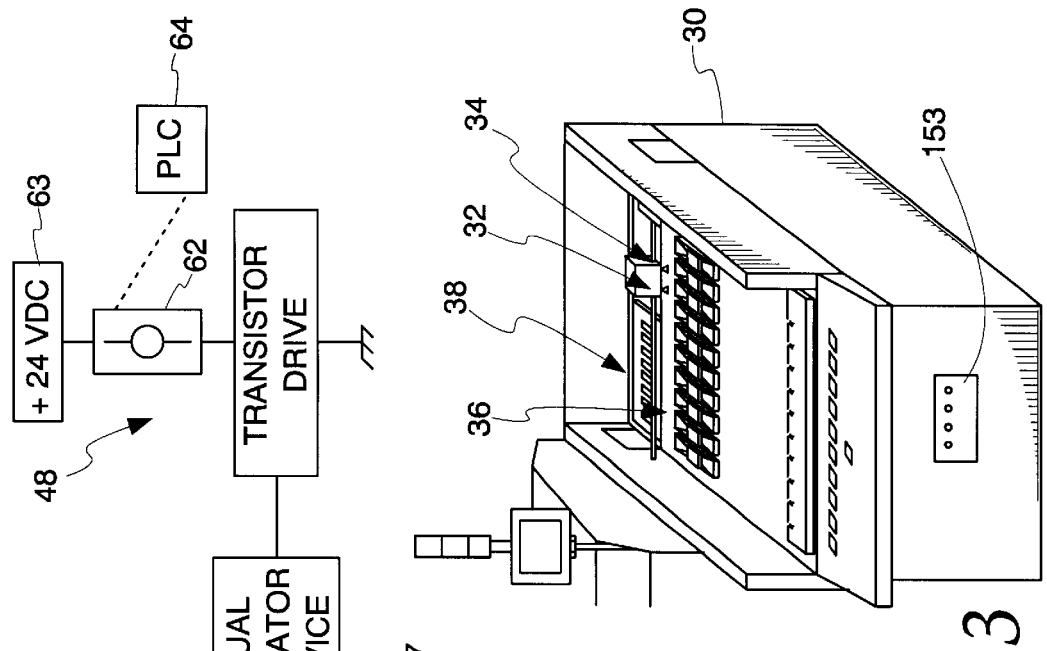
FIG. 4 is a block diagram of a ground check system of the present invention for use in the input module of FIG. 2 or in the sort module of FIG. 3.

In FIG. 4, there is shown a simplified block diagram of the ground check system 40, constructed in accordance with the principles of the present invention and adapted for use in the input module 20 of FIG. 2 and/or in the sort module 30 of FIG. 3. As can be seen, the ground check system 40 includes an ESD voltage sensing portion 41 formed of an operational amplifier 42, a voltage divider 44, and a low offset resistor section 46. The ground check system 40 further includes a visual indicator device 47 and an output buffer section 48.

The operational amplifier 42 functions as a voltage comparator and may be one which is similar to an I.C. chip LM324. The operational amplifier 42 has an inverting input 50, a non-inverting input 52, and an output 54. The voltage divider 44 is interconnected between a power supply voltage or potential 55, which is typically at +12 VDC, and the non-inverting input 52 of the operational amplifier 42. A test handler part 56 corresponding to one of the moving parts of the input module 20 in FIG. 2 or the sort module 30 in FIG. 3 is operatively connected to the voltage divider 44 and to a grounding wire 58. The grounding wire 58 is connected to an earth ground potential 60. The low offset resistor section 46 is also interconnected between the power supply voltage 55 and the inverting input 50 of the operational amplifier 42. The offset resistor section 46 is also operatively connected to the earth ground potential.

The output 54 of the operational amplifier 42 is connected to the output buffer section 48 via the visual indicator device 47. The output buffer section 48 is formed of an NPN bipolar transistor Q1, such as a 2N2222, having a base, emitter, and collector; a relay coil 62; and a programmable logic controller 64. The transistor Q1 has its base connected to the visual indicator device 47, its emitter connected to the earth ground, and its collector connected to one end of the relay coil 62. The other end of the relay coil 62 is coupled to a second power supply voltage 63, which is typically at +24 VDC. The relay 62 is provided with contacts which are operatively connected to the programmable logic controller 64 so as to control the operation of the input and/or sort module of the test handler.

Figure 5:
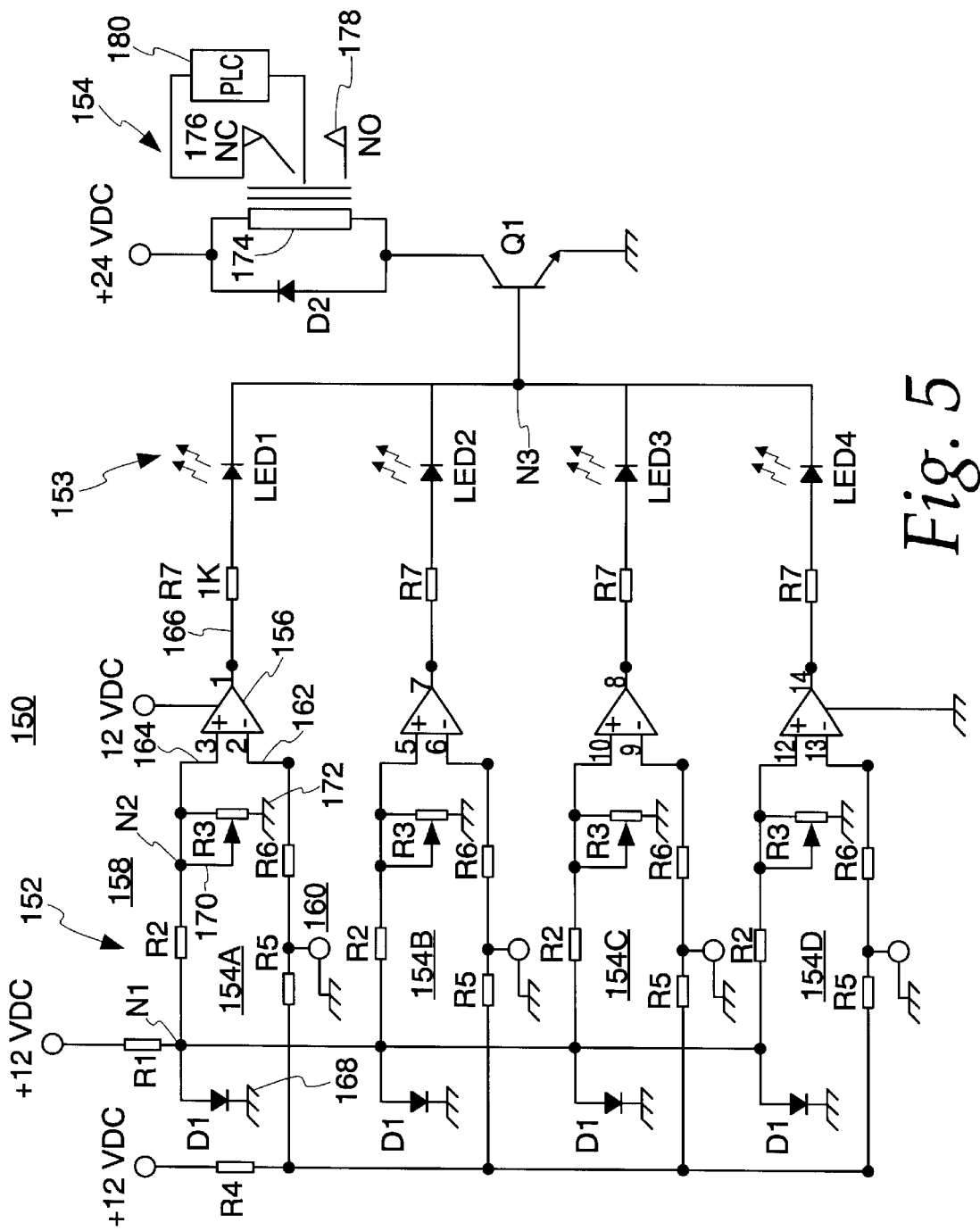
FIG. 5 is a detailed schematic diagram of the ground check system of FIG. 4, constructed in accordance with the principles of the present invention.

With reference to FIG. 5, there is shown a detailed schematic circuit diagram of the ground check system 150 of the present invention in FIG. 4. The ground check system 150 includes the ESD voltage sensing section 152, a visual indicator device 153, and an output buffer section 154. The sensing section 152 is formed of first through fourth identical comparator circuits 154*a*–154*d*. It should be clear to those skilled in the art that each of the comparator circuits 154*a*–154*d* corresponds to the sensing portion 41 of FIG. 4 and are connected in parallel. Each of the comparator circuits is used to sense the ESD voltage associated with a corresponding different moving part of the input and/or sort module of FIG. 2 or FIG. 3, respectively. Since the four comparator circuits 154*a*–154*d* are all identical, it will be sufficient to describe in detail only one of them.

Thus, the comparator circuit 154*a* includes an operational amplifier 156, a voltage divider 158, and a low offset resistor section 160. The operational amplifier 156 functions as a voltage comparator and may be a part of an I.C. chip LM324. The operational amplifier 156 has an inverting input 162 on pin 2, a non-inverting input 164 on pin 3, and an output 166 on pin 1. The operational amplifier 156 corresponds to the operational amplifier 42 in FIG. 4. The voltage divider 158 is formed of a clamping diode D1; resistors R1, R2; and a potentiometer R3. The resistor R1 has its one end connected to a +12 VDC power supply and its other end connected to the anode of the diode D1 and to one end of the resistor R2 at a node N1. The cathode of the diode D1 is connected to an earth ground 168. The other end of the resistor R2 is connected to the wiper arm 170 and one end of the potentiometer R3 and to the pin 3 of the operational amplifier 156 at node N2. The other end of the resistor R3 is connected to earth ground via a grounding wire 172. The grounding wire 172 corresponds to one of the moving parts of the input module 20 or sort module 30. The voltage divider 158 corresponds to the voltage divider 44 of FIG. 4.

The low offset voltage section 160 includes a series connection of resistors R4, R5 and R6 interconnected between the +12 VDC power supply and the inverting input of pin 2 of the operational amplifier 156. The values of the resistors R4–R6 are selected so as to provide a fixed reference voltage or offset voltage of approximately 10 mV to the inverting input (pin 2). The junction of the resistors R5 and R6 are connected to the earth ground potential. The output of the operational amplifier 156 on pin 1 is connected to one end of a current-limiting resistor R7.

The visual alarm indicator device 153 is formed of four light-emitting diodes LED1, LED2, LED3 and LED4. The anode of the diode LED1 is connected to the other end of the current-limiting resistor R7 in the comparator circuit 154a. The anode of the diode LED2 is connected to the other end of the current-limiting resistor R7 in the comparator circuit 154b. The anode of the diode LED3 is connected to the other end of the current-limiting resistor R7 in the comparator circuit 154c. The anode of the diode LED4 is connected to the other end of the current-limiting resistor R7 in the comparator circuit 154d. The cathodes of the diodes LED1, LED2, LED3 and LED4 are connected together at a node N3. The visual alarm indicator device 153 corresponds to the visual indicator device 47 in FIG. 4. In addition, the indicator device 153 is shown mounted on the front portion of the input module 20 of FIG. 2 and on the sort module 30 of FIG. 3 so as to notify an operator of a malfunction in one of the grounding wires.

The output buffer section 154 includes a bipolar NPN-type transistor Q1, a relay coil 174 with normally-closed contacts 176 and normally-opened contacts 178, and a programmable logic controller 180. The transistor Q1 has its base connected to the node N3 and its emitter is connected to the earth ground potential. The collector of the transistor Q1 is connected to one end of the relay coil 174, and the other end of the relay coil is connected to the +24 VDC power supply. The normally-closed contacts 176 are operatively connected to the programmable logic controller 180. A protection diode D2 is connected in parallel across the relay coil 174. The output buffer section 154 corresponds to the section 48 of FIG. 4.

For completeness in the disclosure of the above-described ground check system but not for purposes of limitation, the following representative values and component identifications are submitted. These values and components were employed in a ground check system that was constructed and tested and which provides high quality performance.

| PART | TYPE OR VALUE |
|---|---|
| R1, R2, R4, R6, R7 | 1 K Ohms |
| R3 | 200 K Ohms |
| R5 | 230 Ohms |
| D1, D2 | 1N4001 |
| Q1 | 2N2222 |
| Op Amp 156 | 1/4 LM 324 |

The operation of the ground check system 150 of the present invention in FIG. 5 will now be explained. Under normal operating conditions, the grounding wires 172 associated with one of the moving parts in the input module or sort module of the test handler will be properly connected to the earth ground. The potentiometer R3 is adjusted manually so as to provide a voltage of less than 10 mV to the non-inverting input (pin 3) of the operational amplifier 156. A fixed reference voltage of approximately 10 mV is applied to the inverting input (pin 2) of the operational amplifier through the low offset resistor section 160. As a result, the output (pin 1) of the operational amplifier will be at 0 volts and no current will flow through the light-emitting diode LED1. Thus, the transistor Q1 will be turned off and the relay coil 174 will be deenergized. The normally-closed contacts 176 will remain closed so as to maintain operation of the programmable logic controller 180 and keep the test handler functioning.

In the event of a malfunction in one of the grounding wires 172, such as the grounding wire being loosened or disconnected from the earth ground, the voltage defining the ESD voltage appearing at the non-inverting input (pin 3) of the operational amplifier will become substantially higher than the 10 mV applied to the inverting input (pin 2). Consequently, the output (pin 1) will go to +12 volts so as to turn on the transistor Q1 and the light-emitting diode LED1 will become lit so as to inform the operator of a malfunction in the grounding wire. Further, with the transistor Q1 being rendered conductive, the relay coil 174 will become energized so as to open the normally-closed contacts 176, thereby causing the programmable logic controller 180 to shut down the test handler.

From the foregoing detailed description, it can thus be seen that the present invention provides a ground check system used with a test handler for checking automatically the grounding of the equipment and for shutting down the same if a grounding malfunction exists. The ground check system includes a sensing circuit, a visual indicator device, and an output buffer section. The visual indicator device is mounted on the input module and/or sort module of the test handler and is responsive to an output voltage from the sensing circuit so as to alert an operator of a malfunction in the grounding wires. The output buffer section is also responsive to the output voltage for shutting down the input module and/or output module when there is a malfunction in the grounding wires.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A ground check system used with an input module and/or sort module of a test handler for checking automatically grounding wires associated with moving parts thereof, said grounding system comprising in combination:

sensing means responsive to ESD voltages associated with the grounding wires and to a reference voltage for generating an output voltage;

visual indicator means mounted on the input module and/or sort module of the test handler and being responsive to said output voltage for alerting an operator of a malfunction in the grounding wires;

output buffer means also being responsive to said output voltage for shutting down the input module and/or sort module when there is a malfunction in the grounding wires;

said sensing means including a voltage divider, a low offset resistor section, and a voltage comparator, said voltage comparator being formed of an operational amplifier having an inverting input, a non-inverting input, and an output, said operational amplifier having the inverting input being coupled to said low offset resistor section, the non-inverting input being coupled to the voltage divider, and the output providing said output voltage when there is a malfunction in the grounding wires; and said visual indicator means including at least one light-emitting diode having its anode coupled to the output of said operational amplifier and its cathode coupled to said output buffer means; and wherein said output buffer means includes a bipolar transistor having a base, emitter, and collector; a relay coil with normally-closed contacts; and a programmable logic controller; said transistor having its base connected to the cathode of the at least one light emitting diode, its emitter connected to a ground potential, and its collector connected to one end of the relay coil, the other end of the relay coil being connected to a first power supply potential, the normally-closed contacts of the relay coil being operatively connected to the programmable logic controller so as to shut down the same when there is a malfunction in the grounding wires.

2. A ground check system as claimed in claim 1, wherein said voltage divider is formed of a clamping diode, a first resistor, a second resistor, and a potentiometer; said first resistor, said second resistor and said potentiometer being connected in series between a second power supply potential and a ground potential; said clamping diode being connected in parallel with said second resistor and said potentiometer; the junction of said second resistor and said potentiometer being connected to the non-inverting input of said operational amplifier to provide the ESD voltage.

3. A ground check system as claimed in claim 2, wherein said low offset resistor section is formed of fourth, fifth and sixth resistors connected in series between said second power supply potential and the inverting input of said operational amplifier so as to provide the fixed reference voltage.

4. A ground check system as claimed in claim 3, further comprising a seventh resistor interconnected between the output of said operational amplifier and said visual indicator means.

5. A ground check system as claimed in claim 1, wherein said first power supply potential is approximately +24 VDC.

6. A ground check system as claimed in claim 2, wherein said second power supply potential is approximately +12 VDC.

7. A ground check system as claimed in claim 1, wherein when one of the grounding wires comes loose or disconnected from the ground potential there will be caused to be generated the ESD voltage on the non-inverting input of the operational amplifier.

* * * * *